United States Patent
Xia et al.

(10) Patent No.: US 8,114,187 B2
(45) Date of Patent: Feb. 14, 2012

(54) SYNTHESIS OF PLATINUM NANOSTRUCTURES

(75) Inventors: Younan Xia, Seattle, WA (US); Jingyi Chen, Seattle, WA (US); Thurston Edwin Herricks, Seattle, WA (US)

(73) Assignee: University of Washington through its Center for Commercialization, Seattle, WA (US)

( * ) Notice: Subject to any disclaimer, the term of this patent is extended or adjusted under 35 U.S.C. 154(b) by 734 days.

(21) Appl. No.: 11/197,745

(22) Filed: Aug. 3, 2005

(65) Prior Publication Data

US 2007/0289409 A1   Dec. 20, 2007

Related U.S. Application Data

(60) Provisional application No. 60/598,924, filed on Aug. 3, 2004.

(51) Int. Cl.
*B22F 9/18* (2006.01)
*B22F 9/24* (2006.01)

(52) U.S. Cl. .......................... 75/370; 977/762
(58) Field of Classification Search .............. 977/896, 977/773–775, 777, 810; 75/330, 343, 392, 75/710, 711, 721–724, 732, 733, 736, 741, 75/744, 362, 370–372, 739, 952–954; 428/544, 428/546–548, 565, 570, 615, 655, 668–670, 428/672, 673, 678, 681, 682, 686; 423/1, 423/22, 23; *B22F 9/16, 9/18, 9/24*
See application file for complete search history.

(56) References Cited

U.S. PATENT DOCUMENTS

| | | | |
|---|---|---|---|
| 5,759,230 A * | 6/1998 | Chow et al. | 75/362 |
| 5,772,754 A | 6/1998 | Tanaka et al. | |
| 6,413,487 B1 * | 7/2002 | Resasco et al. | 423/447.3 |
| 6,530,944 B2 | 3/2003 | West et al. | |
| 6,875,253 B2 | 4/2005 | Daimon et al. | |
| 7,585,349 B2 | 9/2009 | Xia et al. | |
| 2001/0009119 A1 * | 7/2001 | Murray et al. | 75/348 |
| 2003/0136223 A1 | 7/2003 | Jin et al. | |
| 2004/0020327 A1 * | 2/2004 | Hattori et al. | 75/348 |
| 2005/0056118 A1 | 3/2005 | Xia et al. | |
| 2005/0085379 A1 * | 4/2005 | Ishihara et al. | 502/180 |
| 2006/0177660 A1 * | 8/2006 | Kumar et al. | 428/403 |
| 2007/0289409 A1 | 12/2007 | Xia et al. | |
| 2008/0003130 A1 | 1/2008 | Xia et al. | |
| 2009/0282948 A1 | 11/2009 | Xia et al. | |

OTHER PUBLICATIONS

Y. Sun et al., Nano Letters, vol. 2, No. 2 (2002) pp. 165-168.*
V. I. Spitsyn et al., Atomnaya Energiya, vol. 17, No. 2 (1964) pp. 119-123 (original), pp. 827-831 (translation) [English translation provided].*
C. Li et al., Materials Letters, vol. 58, Iss. 1-2 (2004 but available online Jun. 14, 2003), pp. 196-199.*
Jeyadevan, B.; Hobo, A.; Urakawa, K.; Chinnasamy, C.N.; Shinoda, K.; and Tohji, K., "Towards direct synthesis of fct-FePt nanoparticles by chemical route," Journal of Applied Physics, vol. 93, No. 10, pp. 7574-7576 (2003).*

(Continued)

*Primary Examiner* — Scott Kastler
*Assistant Examiner* — Vanessa Luk
(74) *Attorney, Agent, or Firm* — McDonnell Boehnen Hulbert & Berghoff LLP

(57) ABSTRACT

A method for synthesizing noble metal nanostructures is disclosed. The method involves reacting under heat a noble metal precursor, a polyol reducing agent, and a stabilizing polymer. Morphological control is achieved by controlling the reduction rate of the noble metal.

11 Claims, 10 Drawing Sheets

OTHER PUBLICATIONS

Chen, Jingyi; Herricks, Thurston; Geissler, Matthias; Xia, Younan; "Single-Crystal Nanowires of Platinum Can Be Synthesized by Controlling the Reaction Rate of a Polyol Process," Journal of the American Chemical Society, 126 (2004), pp. 10854-10855. Supporting Information attached.*

Chen, Chun-Wei; Tano, Daisuke; Akashi, Mitsuru; "Colloidal Platinum Nanoparticles Stabilized by Vinyl Polymers with Amide Side Chains: Dispersion Stability and Catalytic Activity in Aqueous Electrolyte Solutions," Journal of Colloid and Interface Science, 225 (2000), pp. 349-358.*

Y. Xiong, J. Chen, B. Wiley, Y. Xia, Y. Yin, Z.-Y. Li, "Size-Dependence of Surface Plasmon Resonance and Oxidation for Pd Nanocubes Synthesized via a Seed Etching Process," Nano Letters, vol. 5, No. 7, pp. 1237-1242, Published on Web Jun. 3, 2005.*

Sun et al., "Shape-Controlled Synthesis of Gold and Silver Nanoparticles," *Science*, vol. 298, Dec. 13, 2002, pp. 2176-2179.

Sun et al., "Alloying and Dealloying Processes Involved in the Preparation of Metal Nanoshells Through a Galvanic Replacement Reaction," Nano Letters, vol. 0, No. 0, Sep. 11, 2003, Department of Chemistry, University of Washington, pp. A-D.

Sun et al., "Template-Engaged Replacement Reaction: A One-Step Approach to the Large-Scale Synthesis of Metal Nanostructures with Hollow Interiors," Nano Letters 2002, vol. 2, No. 5, Feb. 21, 2002, Department of Chemistry, University of Washington, pp. 481-485.

Sun et al., "Increased Sensitivity of Surface Plasmon Resonance of Gold Nanoshells Compared to that of Gold Solid Colloids in Response to Environmental Changes," Analytical Chemistry, vol. 74, No. 20, Oct. 15, 2002, pp. 5297-5305.

Sun et al., "Metal Nanostructures with Hollow Interiors," Advanced Materials, 15, No. 7-8, Apr. 17, 2003, pp. 641-646.

Sun et al., "Uniform Silver Nanowires Synthesis by Reducing AgNO3 with Ethylene Glycol in the Presence of Seeds and Poly(Vinyl Pyrrolidone)," Chem. Mater., pp. 14, 4736-4745 (May 17, 2002).

Sun et al., "Large-Scale Synthesis of Uniform Silver Nanowires Through a Soft, Self-Seeding, Polyol Process, Advanced Materials," 14, No. 11, Jun. 5 pp. 833-837, (Jun. 5, 2002).

Sun et al., "Multiple-Walled Nanotubes Made of Metals," Communication to Advanced Materials, Jul. 2003.

Sun et al., "Insights into the Replacement Reaction Between Silver Nanostructures and Chloroauric Acid in Aqueous Medium," Article to JACS, Oct. 2003, 23 pages.

Jana et al., "Wet Chemical Synthesis of Silver Nanorods and Nanowires of Controllable Aspect Ratio," The Royal Society of Chemistry, pp. 617-618. (Jan. 15, 2001).

Ducamp-Sanguesa, et al., "Synthesis and Characterization of Fine and Monodisperse Silver Particles of Uniform Shape," Journal of Solid State Chemistry, pp. 272-280 (Mar. 23, 1992).

Carotenuto, et al., "Preparation and Characterization of Nano-Sized Ag/PVP composites for Optical Applications," The European Physical Journal B, pp. 11-17 (Jul. 26, 2000).

Murphy, "Nanocubes and Nanoboxes," Science, vol. 298, Dec. 13, 2002, pp. 2139-2141.

Preliminary Amendment filed on Mar. 18, 2008 in co-pending U.S. Appl. No. 11/701,974, titled Methods for Production of Silver Nanostructures, filed Feb. 1, 2007.

Office Action issued on Feb. 9, 2009 in co-pending U.S. Appl. No. 11/701,974, titled Methods for Production of Silver Nanostructures, filed Feb. 1, 2007.

Preliminary Amendment filed on May 18, 2005 in co-pending U.S. Appl. No. 10/732,910, titled Methods of Nanostructure Formation and Shape Selection, filed Dec. 9, 2003.

Office Action issued on Mar. 23, 2007 in co-pending U.S. Appl. No. 10/732,910, titled Methods of Nanostructure Formation and Shape Selection, filed Dec. 9, 2003.

Response to Office Action filed on May 29, 2007 in co-pending U.S. Appl. No. 10/732,910, titled Methods of Nanostructure Formation and Shape Selection, filed Dec. 9, 2003.

Office Action issued on Jun. 22, 2007 in co-pending U.S. Appl. No. 10/732,910, titled Methods of Nanostructure Formation and Shape Selection, filed Dec. 9, 2003.

Response to Office Action filed on Nov. 21, 2007 in co-pending U.S. Appl. No. 10/732,910, titled Methods of Nanostructure Formation and Shape Selection, filed Dec. 9, 2003.

Office Action issued on Feb. 5, 2008 in co-pending U.S. Appl. No. 10/732,910, titled Methods of Nanostructure Formation and Shape Selection, filed Dec. 9, 2003.

Response to Office Action filed on Aug. 5, 2008 in co-pending U.S. Appl. No. 10/732,910, titled Methods of Nanostructure Formation and Shape Selection, filed Dec. 9, 2003.

Examiner Interview Summary issued on Aug. 11, 2008 in co-pending U.S. Appl. No. 10/732,910, titled Methods of Nanostructure Formation and Shape Selection, filed Dec. 9, 2003.

Office Action issued on Oct. 21, 2008 in co-pending U.S. Appl. No. 10/732,910, titled Methods of Nanostructure Formation and Shape Selection, filed Dec. 9, 2003.

Response materials filed on Feb. 23, 2009 in reply to the Office Action dated Oct. 21, 2008 in co-pending U.S. Appl. No. 10/732,910, which include a Request for Continued Examination, Declarations Under 37 C.F.R. § 1.132 by Yugang Sun and Younan Xia, Amendments to the Claims, and Accompanying Remarks.

Sun et al., "Crystalline Silver Nanowires by Soft Solution Processing," Nano Letters 2002, vol. 2, No. 2, Department of Chemistry, University of Washington, pp. 165-168, (Dec. 4, 2001).

Sun et al., "Mechanistic Study on the Replacement Reaction Between Silver Nanostructure and Chlorauric Acid in Aqueous Medium," J. Am. Chem. Soc., vol. 126, Issue 12, pp. 3892-3901(Mar. 3, 2004).

Spitsyn et al., "Some Characteristics of the Process of Oxidizing Uranium by Tervalent Iron Ions," Atomnaya Energiya, vol. 17, No. 2, (Aug. 1964) pp. 119-123 (original), pp. 827-831 (English-language translation) [Only the English translation is provided].

Li et al., "Ultrasonic Solvent Induced Morphological Change of Au Colloids," Material Letters, vol. 58, Issue 1-2, pp. 196-199 (2004)— Available online Jun. 14, 2003.

Wiley et al., "Polyol Synthesis of Silver Nanoparticles: Use of Chloride and Oxygen to Promote the Formation of Single-Crystal, Truncated Cubes and Tetrahedrons," Nano Letters, vol. 4, Issue 9, pp. 1733-1739 (Aug. 7, 2004).

Wei, G. et al., "Shape Separation of Nanometer Gold Particles by Size-Exclusion Chromatography," Analytical Chemistry, vol. 71, No. 11, pp. 2085-2091 (Jun. 1, 1999).

Porter, L. et al., Controlled Electroless Deposition of Noble Metal Nanoparticle Films on Germanium Surfaces, Nano Letters, vol. 2, No. 10, pp. 1067-1071 (Sep. 7, 2002).

Notice of Allowance dated Apr. 27, 2009 in U.S. App. No. 10/732,910, now U.S. Pat. No. 7,585,349.

Supplemental Notice of Allowability dated Jun. 11, 2009 in U.S. App. No. 10/732,910, now U.S. Pat. No. 7,585,349.

Application for Patent Term Adjustment including Request for Reconsideration dated Nov. 9, 2009 in U.S. Appl. No. 10/732,910, now U.S. Pat. No. 7,585,349.

Statement of Facts Accompanying Request for Reconsideration of Patent Term Adjustment (including Exhibits) dated Nov. 9, 2009 in U.S. Appl. No. 10/732,910, now U.S. Pat. No. 7,585,349.

Notice of Allowance dated May 27, 2010 in U.S. Appl. No. 11/701,974, now U.S. Patent Publication No. 2008/0003130.

Amendment and Response to Office Action dated Mar. 29, 2010 in U.S. Appl. No. 11/701,974, now U.S. Patent Publication No. 2008/0003130.

Replacement Drawings associated with Amendment and Response dated Mar. 29, 2010 in U.S. Appl. No. 11/701,974, now U.S. Patent Publication No. 2008/0003130.

Terminal Disclaimer dated Mar. 29, 2010 in U.S. Appl. No. 11/701,974, now U.S. Patent Publication No. 2008/0003130.

Office Action dated Sep. 9, 2009 in U.S. Appl. No. 11/701,974, now U.S. Patent Publication No. 2008/0003130.

Amendment and Response to Requirement for Restriction and Election of Species dated Jun. 9, 2009 in U.S. Appl. No. 11/701,974, now U.S. Patent Publication No. 2008/0003130.

Office Action dated Feb. 9, 2009 in U.S. Appl. No. 11/701,974, now U.S. Patent Publication No. 2008/0003130.
Preliminary Amendment dated Mar. 19, 2008 in U.S. Appl. No. 11/701,974, now U.S. Patent Publication No. 2008/0003130.
Office Action dated Aug. 2, 2010 in U.S. Appl. No. 12/509,873, now U.S. Patent Publication No. 2009/0282948.
Amendment and Response to Requirement for Restriction dated May 20, 2010 in U.S. Appl. No. 12/509,873, now U.S. Patent Publication No. 2009/0282948.
Office Action (Restriction Requirement) dated Apr. 20, 2010 in U.S. Appl. No. 12/509,873, now U.S. Patent Publication No. 2009/0282948.
Fievet, F. et al., "Preparing Monodisperse Metal Powders in Micrometer and Submicrometer Sizes by the Polyol Process" MRS Bulletin, Dec. 1989, pp. 29-34.

* cited by examiner

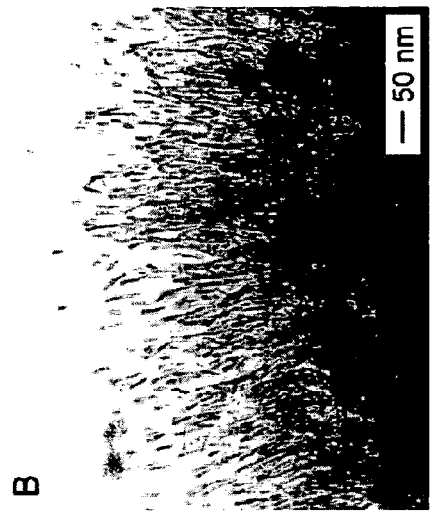
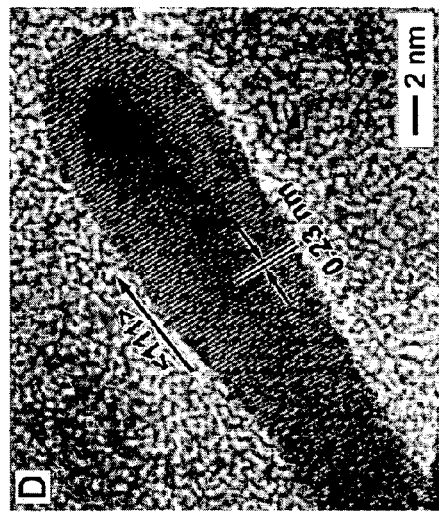
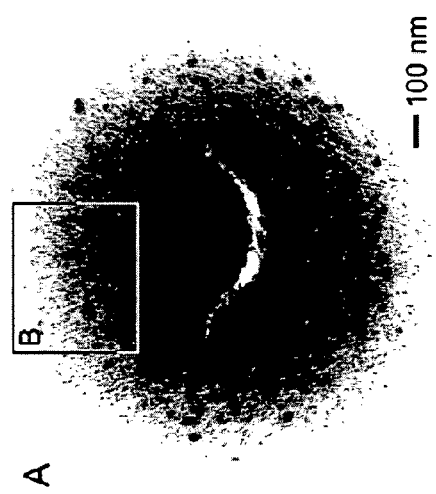
Figure 7A
Figure 7B
Figure 7C
Figure 7D

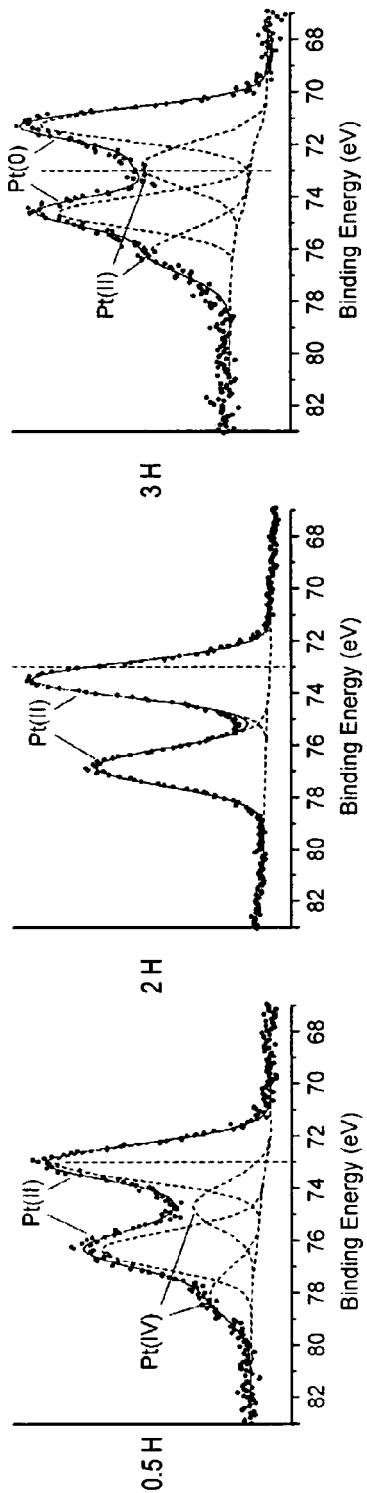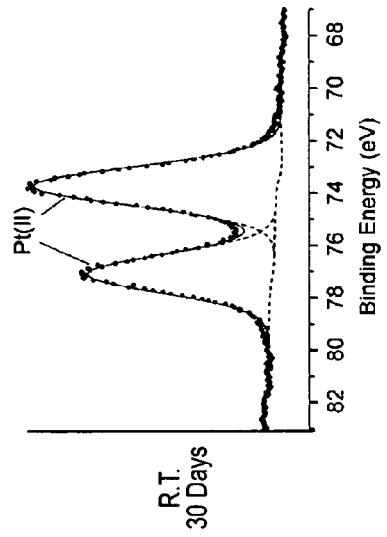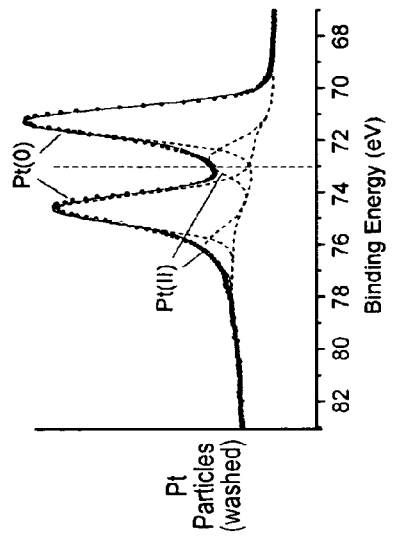
Figure 9A  Figure 9B  Figure 9C  Figure 9D  Figure 9E

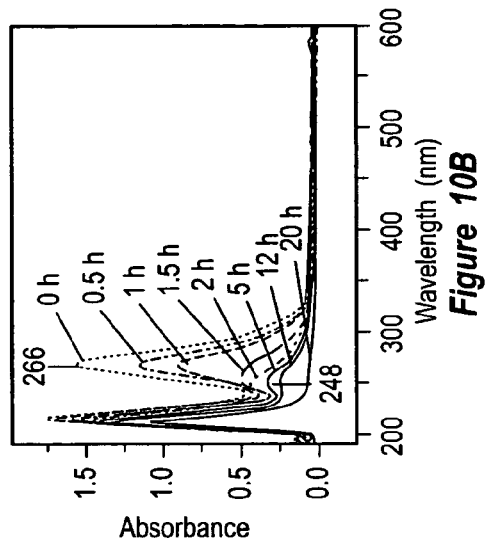
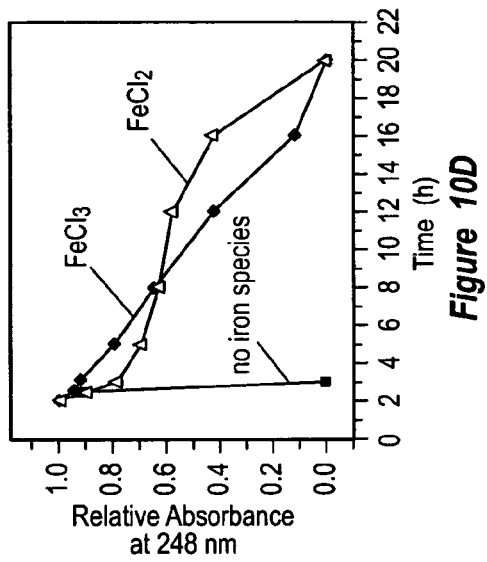
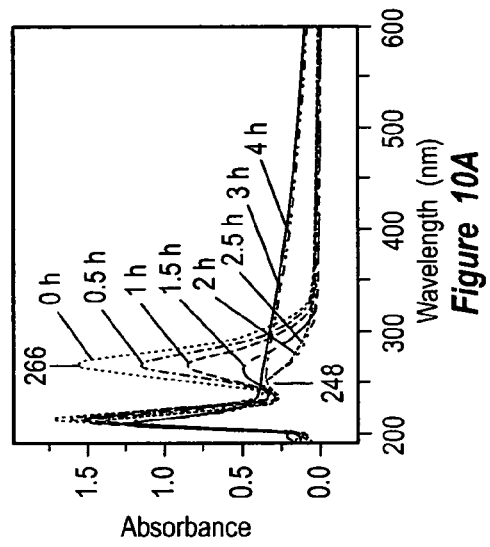
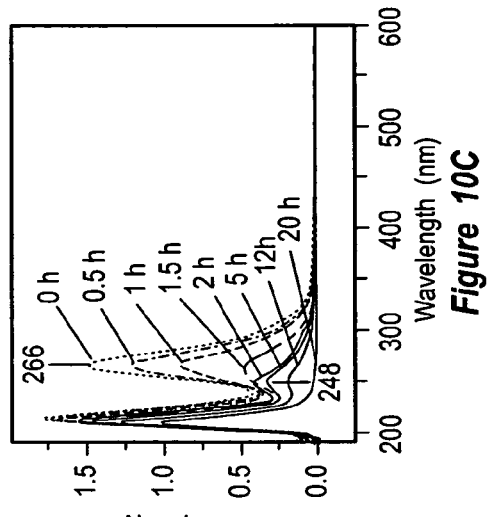
Figure 10A
Figure 10B
Figure 10C
Figure 10D

US 8,114,187 B2

SYNTHESIS OF PLATINUM NANOSTRUCTURES

RELATED APPLICATIONS

This application claims priority to Provisional Patent Application Ser. No. 60/598,924 which was filed on Aug. 3, 2004 and is titled Synthesis of Single Crystal Platinum Nanowires and Nanorods. Ser. No. 60/598,924 is hereby incorporated.

FEDERALLY SPONSORED RESEARCH OR DEVELOPMENT

This work has been supported in part by a DARPA-DURINT subcontract from Harvard University, a fellowship from the David and Lucile Packard Foundation and an IGERT Fellowship Award (supported by the NSF, DGE-9987620).

TECHNICAL FIELD

The present disclosure relates generally to the synthesis of metal nanostructures. More particularly, the present disclosure relates to the synthesis of platinum and other noble metals.

BRIEF DESCRIPTION OF THE DRAWINGS

FIGS. 1A-1E depict different nanostructures formed by the syntheses shown in FIG. 1.

FIG. 3A is at 0°. FIG. 3B is at −45°; and FIG. 3C is at 45°. The sample was taken from the product shown in FIG. 1C. FIG. 3D is an HRTEM image of the tip of one of the ends of this platinum tetrapod, indicating that each arm was a single crystal, with its growth direction along the <111> axis.

FIGS. 4A-4B are tetrahedral and FIGS. 4C-4D are square-planar. The HRTEM images indicate that all the arms grew along the <111> direction. While the square planar structure has a twin plane in the middle, the tetrahedral one is a single-crystal because all the four arms display the same fringe spacing and orientation.

FIGS. 6A-6C are overviews of the product at three different magnifications. FIG. 6D is a cross-sectional view of the edge of a particle as boxed in FIG. 6A, showing that the interior of this particle was filled with platinum nanoparticles of ~5 nm in size while the surface was covered by a thin layer of platinum nanowires.

FIG. 7A is a cross-sectional TEM image of an individual agglomerate that was taken from its micro-tomed sample. FIG. 7B is a blown-up TEM image of the edge of the particle shown in FIG. 7A, indicating that the platinum nanowires are uniaxially aligned in the plane of cleavage due to the shear force induced by the diamond knife. FIG. 7C is a TEM image and electron diffraction pattern of platinum nanowires that had been released from the surface of agglomerates via sonication. FIG. 7D is an HRTEM image of the tip of an individual platinum nanowire, indicating that it was a single crystal, with its growth direction along the <111> axis.

FIGS. 9A-9E are high-resolution XPS Pt(4f) spectra showing the evolution of different platinum species during the synthesis when no $Fe^{2+}$ or $Fe^{3+}$ species was added to the reaction mixture.

FIGS. 10A-10C are UV-vis spectra of reaction solutions taken at different stages of the synthesis. FIG. 10A shows the results with no iron species; FIG. 10B shows the results with the addition of $FeCl_2$; and FIG. 10C shows the results with the addition of $FeCl_3$. FIG. 10D provides a comparison of the time dependence for the Pt(II) species (see FIG. 5) under three different synthetic conditions. The change in concentration of the intermediate species was followed by the decay of the relative absorbance at ~248 nm.

DETAILED DESCRIPTION OF PREFERRED EMBODIMENTS

Figure 1:
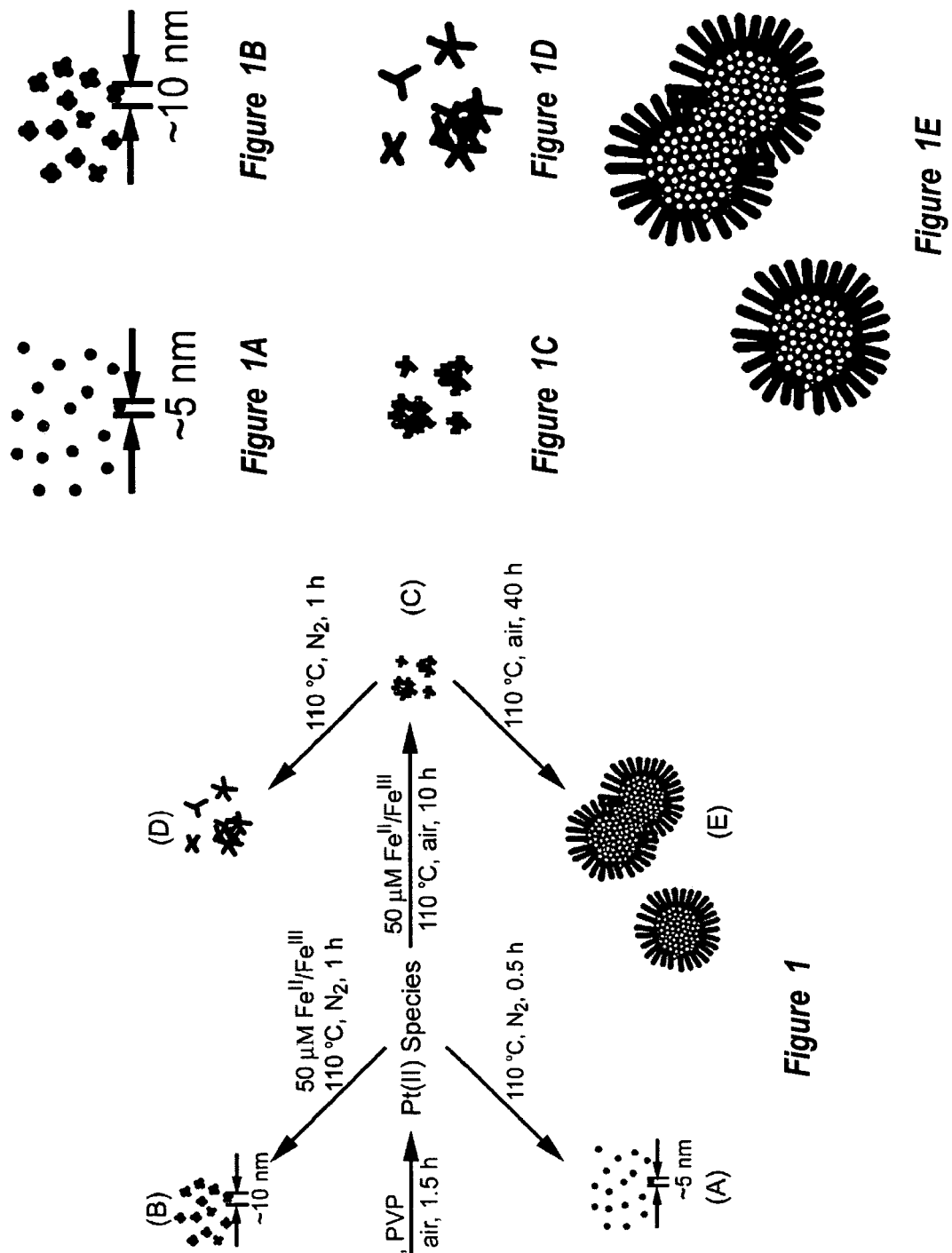
FIG. 1 is a schematic illustration of four different routes for controlling the kinetics of polyol reduction and the corresponding morphologies observed for the platinum nanostructures.

A great deal of effort has been directed towards the synthesis of nanostructures having well-controlled morphology. It is generally accepted that the morphology (including dimensionality and shape) of a nanostructure may provide a tuning knob as powerful as the size when one needs to tailor the electronic, optical, magnetic, and catalytic properties of a functional material such as a noble metal.

In one embodiment of forming a noble metal nanostructure, a noble metal precursor, a polyol reducing agent such as ethylene glycol and a stabilizing polymer such as poly(vinyl pyrrolidone) are heated. The temperature may range from about 80° C. to about 120° C. in one embodiment and in a range from about 100° C. to about 120° C. in another embodiment. $Fe^{II}$ or $Fe_{III}$ species can be simultaneously introduced into the reaction mixture. $Fe^{II}$ or $Fe_{III}$ species can also be immediately introduced after forming the reaction mixture or at any time before forming Pt atoms such as up to 2 hours or 1 hour after forming the reaction mixture. The reaction may occur in the presence of oxygen, air and nitrogen, however, oxygen and the oxygen in air permit the formation of structures which are described below. In particular, nanoparticles are yielded which are monodisperse in size and have well-defined facets.

Platinum is an example of a noble metal which can be formed with the synthesis methods disclosed herein. Nanostructures can also be formed from other noble metals such as palladium and rhodium by the methods disclosed herein.

Platinum plays important roles in many industrial applications. For example, it serves as a catalyst in the reduction of pollutant gases emitted from automobiles, synthesis of nitric acid, oil cracking, and proton exchange membrane (PEM) fuel cells. These applications use platinum in the form of fine particles. Since the reactivity and selectivity of platinum nanostructures in a catalytic reaction are highly dependent on the morphology and thus the crystallographic planes exposed on the surface, it is advantageous for platinum nanostructures to be produced with monodispersed size and well-defined morphology.

The embodiments disclosed herein enable the morphology of platinum nanostructures to be readily controlled by manipulating the reduction kinetics of a polyol synthesis. More specifically, platinum nanostructures in the form of spherical particles, star-shaped particles, branched multipods, and uniform nanowires are synthesized by coupling the polyol reduction of a platinum precursor with the $Fe^{II}/Fe^{III}$ redox pair and the adsorption of oxygen and nitrogen gases. While the disclosure is specifically directed to the synthesis of platinum nanostructures, the method is also relevant to the shape-controlled synthesis of other noble metals such as palladium and rhodium.

A trace amount of iron species ($Fe^{II}$ or $Fe^{III}$) may be added to a polyol process to significantly alter the growth kinetics of platinum nanostructures and thus induce the formation of platinum nanowires characterized by uniform diameters and relatively high aspect ratios. In other embodiments, the reduction kinetics are further manipulated to obtain several other morphologies such as branched multipods. For example, heat may be applied after completion of the reaction for variable amounts of time such as at least about 10 hours, about 20 hours or within a range between about 10 hours to about 20 hours or 40 hours to obtain different structures.

In general, it has been found that highly anisotropic platinum nanostructures are formed at extremely low supersaturations. If the reduction proceeds too quickly and hence the supersaturation is too high, only isotropic, spherical platinum nanoparticles are produced. Based on the x-ray photoelectron spectroscopy (XPS) and ultraviolet visible spectroscopy (UV-Vis) results, the polyol reduction of a $Pt^{IV}$ precursor is believed to proceed through two steps with the involvement of a $Pt^{II}$ intermediate. As a general trend, a slower reduction rate for the $Pt^{II}$ species ultimately led to the formation of anisotropic platinum nanostructures more deviated from the thermodynamic shape of a face-centered cubic metal.

One embodiment of synthesizing, via the polyol process, platinum nanostructures with a number of distinct morphologies, involves the reduction of $H_2PtCl_6$ by ethylene glycol to produce $Pt^{II}$ and then $Pt^0$ at 110° C. Morphological control is achieved by limiting the reduction rate from $Pt^{II}$ to $Pt^0$ through coupling with the $Fe^{II}/Fe^{III}$ redox pair and/or blocking of self-catalytic sites by oxygen adsorption. Platinum nanowires of about 100 nm in length and about 5 nm in diameter were synthesized by reducing $H_2PtCl_6$ with ethylene glycol in the presence of poly(vinyl pyrrolidone) (PVP), and a trace amount of $Fe^{3+}$ or $Fe^{2+}$. The wires were generated at the final stage of the synthesis, which involved the formation of several intermediate species. The $Fe^{3+}$ or $Fe^{2+}$ ions had dual functions in the synthesis: they induced aggregation of platinum nanoparticles into larger structures that served as the nucleation sites; and they greatly reduced the reaction rate and supersaturation level to induce anisotropic growth. The platinum nanowires can be readily separated from the surfaces of the agglomerates, and obtained as pure samples by centrifugation.

| Standard Electrical Potentials of Redox Reactions that Might be Involved in the Synthesis of Platinum Nanostructures | |
|---|---|
| Redox Reaction | Standard Electrical Potentials (V) |
| $PtCl_6^{2-} + 2e^- \leftrightarrow PtCl_4^{2-} + 2Cl^-$ | 0.74 |
| $PtCl_4^{2-} + 2e^- \leftrightarrow Pt^0 + 4Cl^-$ | 0.73 |
| $Fe^{3+} + e^- \leftrightarrow Fe^{2+}$ | 0.77 |
| $Fe^{2+} + 2e^- \leftrightarrow Fe$ | −0.409 |
| $Fe^{3+} + 3e^- \leftrightarrow Fe$ | −0.036 |
| $O_2 + 4H^+ + 4e^- \leftrightarrow 2H_2O$ | 1.23 |

EXAMPLES OF SYNTHESIZING PLATINUM NANOSTRUCTURES

The following specific examples are included for illustrative purposes only and are not to be considered as limiting to this disclosure. The chemicals used in the following examples are either commercially available or can be prepared according to standard literature procedures by those skilled in the art of synthesis.

Example 1

FIG. 1 shows the method for synthesizing platinum and various alternative steps taken to create different structures. It is worth noting that the same amount of PVP was present in all four syntheses illustrated in FIG. 4, so the striking difference in morphology was not caused by PVP. It is believed that PVP molecules in these syntheses only functionalize as a stabilizer to prevent the resultant nanoparticle from aggregation into larger structures.

Typically, 4 mL ethylene glycol (EG, J. T. Baker) was placed in a three-neck flask (equipped with a reflux condenser and a magnetic stirring bar embedded in PYREX® glass) and heated in air at 110° C. for 1 hour to boil off any trace amount of water. Meanwhile, 0.033 g of hexachloroplatinic acid ($H_2PtCl_6$, Aldrich) and 0.045 g of poly(vinyl pyrrolidone) (PVP, M.W.=55,000, Aldrich) were separately dissolved in 2 mL ethylene glycol at room temperature. The molar ratio between $H_2PtCl_6$ and the repeating unit of PVP was controlled at 1:5. These two EG solutions were then added simultaneously to the flask dropwise within 1.5 minutes. The reaction was continued with heating at 110° C. in air for 1.5 hour. The solution turned from golden orange to green yellow, indicating the formation of $Pt^{II}$ species as the intermediate. The reaction was then protected with nitrogen and it turned to brown and finally dark brown in 1 hour.

After the reaction proceeded in air at 110° C. for 1.5 hour, all the $Pt^{IV}$ precursor was converted into $Pt^{II}$ species. For iron-mediated synthesis, 20 μL of 20 mM iron species ($FeCl_3$ or $FeCl_2$, Aldrich, both pre-dissolved in EG) was introduced into the system after the reaction had proceeded in air at 110° C. for 1.5 hour (or when the solution turned into a green-yellow color). In this case, the final solution was colorless with black precipitate settled at the bottom of the flask. When nitrogen protection was present for different periods of time during the iron-mediated reduction, products having different morphologies were obtained: i) star-like nanoparticles were formed if nitrogen protection was provided immediately after the formation of $Pt^{II}$ species; and ii) branched nanostructures were produced if nitrogen protection was supplied after the $Pt^{II}$ species had been left in air and at 110° C. for 10 hours. In general, the longer the $Pt^{II}$ species were kept in air before application of nitrogen protection, the severer the final product would agglomerate. In the last step, the product was collected by centrifugation, washed with ethanol several times to remove ethylene glycol and excess PVP, and characterized by scanning electron microscope (SEM), transmission electron microscope (TEM), as well as high-resolution TEM. The SEM images were taken using a field emission microscope (FEI, Sirion XL) operated at an accelerating voltage of 10-20 kV. The TEM images and diffraction patterns were obtained using a JEOL microscope (1200EX 11) operated at 80 kV. The HRTEM images were captured on a Tecnai $G^2$ F20 operated at 200 kV.

When cooled down to room temperature and stored in a vial under ambient conditions, the $Pt^{II}$ intermediate could exist for more than one month without being further reduced to $Pt^0$ atoms. However, if the reaction was continued with heating in air at 110° C., the $Pt^{II}$ species could be fully reduced to produce spherical platinum nanoparticles of ~5 nm in diameter within a period of 1 hour. In this case, the reduction of $Pt^{II}$ species could be greatly accelerated via an auto-catalytic process once some platinum nuclei had formed in the solution.

When this reduction was carried out under nitrogen gas, the reduction of $Pt^{II}$ to $Pt^0$ became faster than in air, and spherical nanoparticles (as shown in FIG. 1A) were formed in the solution within 0.5 hour. This observation implies that the adsorption of oxygen from air onto the surface of Pt nuclei was able to slow down the auto-catalytic reduction of $Pt^{II}$ species. Although the presence of oxygen could slow down this process, the reduction was still too fast to induce the formation of structures deviated from the equilibrium shape. In contrast, reduction of the $Pt^{II}$ species could be largely diminished when $Fe^{II}$ or $Fe^{III}$ species was introduced into the reaction mixture. In this case, $Fe^{III}$ was able to oxidize both Pt atoms and nuclei back to $Pt^{II}$ species and thus significantly reduce the supersaturation of Pt atoms. Since the resultant $Fe^{II}$ could be recycled back to $Fe^{III}$ by oxygen, only a small amount of $Fe^{III}$ was needed in this synthesis. For the same reason, both $Fe^{II}$ and $Fe^{III}$ species have the same function in controlling the reduction kinetics. The present work suggests that oxygen can slow down the growth rate through both surface adsorption and etching (when coupled with the $Fe^{II}/Fe^{III}$ species) mechanisms. In general, it is hard to single out which mechanism is the dominating one because both retardation effects have a strong dependence on the concentrations of oxygen and the $Fe^{II}/Fe^{III}$ species. By taking advantage of these two mechanisms, the reduction rate of $Pt^{II}$ species can be regulated to yield the products shown in FIGS. 1A-1E. In general, as the reduction became slower, the growth of {111} planes became more, predominant leading to the formation of highly anisotropic (branched and then one-dimensional) nanostructures.

FIG. 1 summarizes the major products that were observed when a trace amount of $Fe^{II}$ or $Fe^{III}$ species (with a final concentration of 50 μM) and/or air or nitrogen was introduced into the reaction system after the formation of $Pt^{II}$ species. Depending on whether the reaction was continued under air or nitrogen, the platinum nanostructures were found to display different morphologies. If the reaction was allowed to proceed under nitrogen protection, star-shaped nanoparticles (as shown in FIG. 1B) were produced over a period of 1 hour. When the reduction was continued in air, it proceeded at a much slower rate and the nanostructures became more branched and subsequently assembled into submicrometer-sized agglomerates (as shown in FIG. 1C). Towards the end of this reaction, the $Pt^{II}$ species were reduced at an extremely slow rate to generate uniform platinum nanowires (as shown in FIG. 1E) on the surface of each agglomerate. However, when nitrogen was applied, the reduction rate was slightly increased, resulting in the formation of multipods with highly branched structures (as shown in FIG. 1D).

Figure 2C:
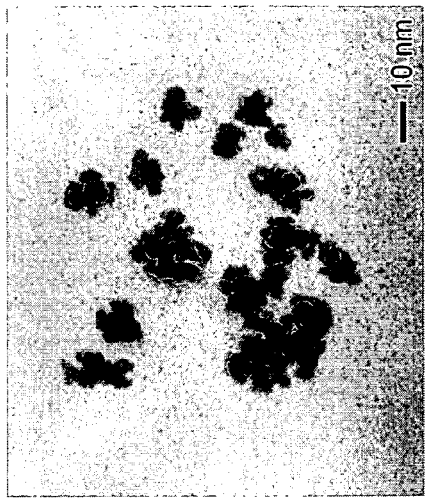
FIGS. 2A-2D are TEM images and FIGS. 2E-2F are SEM images of platinum nanostructures that have been obtained by controlling the reduction rate of a polyol process. The product corresponds to the morphology labeled as 1A to 1E in FIG. 1, respectively. The inset of FIG. 2D shows a typical electron diffraction pattern of the branched nanostructures; and the image in FIG. 2F shows a blow-up of nanowires grown at the surface layer depicted in FIG. 2E.
Figure 2F:
Figure 2B:
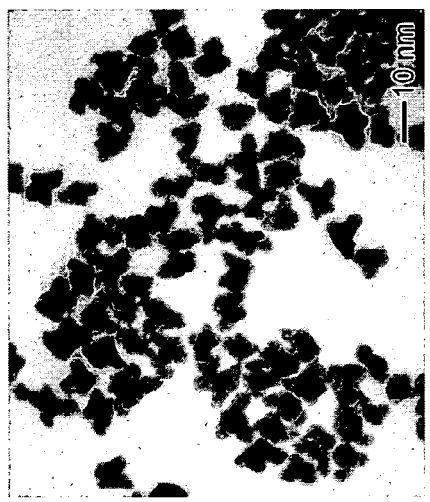
Figure 2E:
Figure 2A:
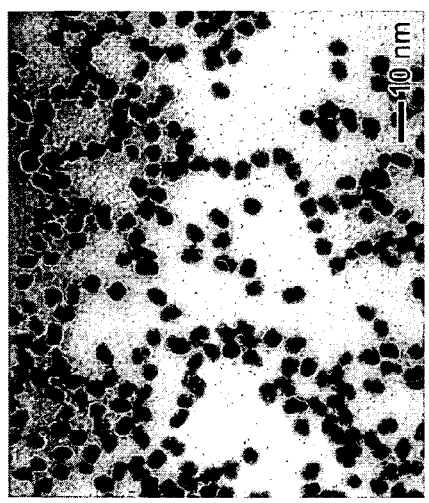
Figure 2D:
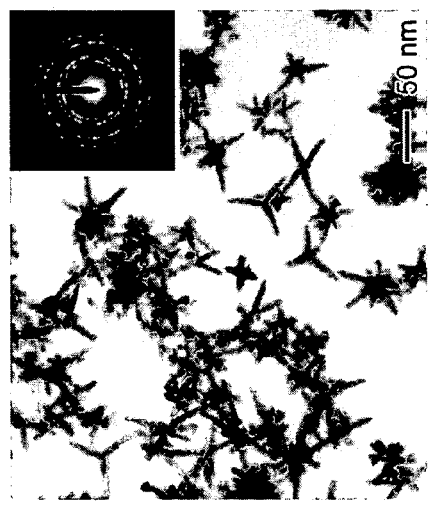

FIGS. 2A-2E shows TEM and SEM images of the platinum nanostructures corresponding to the products illustrated in FIGS. 1A-1E. Consistent with the schematic drawing in FIG. 1, the products displayed a number of distinct morphologies depending on the exact experimental conditions. FIG. 1A shows TEM image of the platinum nanoparticles where the reduction of $Pt^{II}$ intermediate was performed under nitrogen in the absence of $Fe^{II}$ or $Fe^{III}$ species. The nanoparticles were roughly spherical in shape, with a mean diameter of ~5 nm. Note that the spherical shape is expected for a face-centered cubic metal under the thermodynamic framework. FIG. 2B shows TEM image of the platinum nanoparticles that were obtained under conditions similar to those used in FIG. 2A, except the addition of 50 μM $Fe^{II}$ or $Fe^{III}$ species. In this case, the particles were enlarged in dimension and they started to branch into a star-shaped morphology. FIG. 2C shows TEM image of a sample that was obtained by reducing the $Pt^{II}$ intermediate in air for 10 hours. Due to the presence of oxygen, the reduction was much slower (relative to process which produced the product shown in FIG. 2B) and the product became more highly branched and eventually entangled into large agglomerates. FIG. 2D shows TEM image of the product that was obtained when the $Pt^{II}$ intermediate was heated in air for 10 hour, followed by introduction of nitrogen for 1 hour. The resultant nanostructures further branched out to generate multipods with an overall dimension on the scale of 50 nm. The inset shows a typical electron diffraction pattern recorded from an ensemble of such highly branched nanostructures, confirming that they were composed of pure face-centered cubic platinum. FIG. 2E shows SEM image of the platinum structures when the iron-mediated reduction was carried out in air. The product shown in FIG. 1E and FIG. 2E contained micrometer-scale agglomerates of platinum nanoparticles with their surfaces covered by a dense array of uniform nanowires. These agglomerates could further fuse into larger structures. FIG. 2F gives a blow-up view of the portion indicated by a box in FIG. 2E. It is clear that the as-synthesized nanowires were monodispersed in size distribution and their averaged diameter was about 5 nm. Because the nanowires were loosely attached to the surface of each agglomerate, they could be readily released via brief sonication without breaking the agglomerates. The released nanowires could be recovered by centrifugation and then dispersed in ethanol or water without introducing additional surfactants.

Figure 3B:
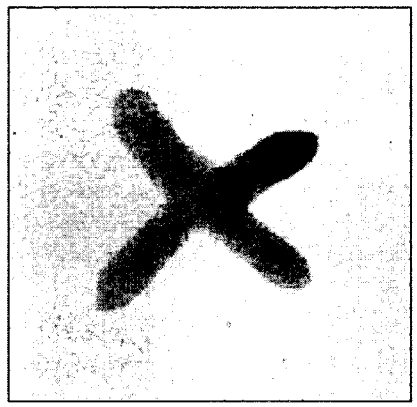
FIGS. 3A-3D are TEM images of a platinum tetrapod tilted by different angles against the axis indicated as an arrow.
Figure 3D:
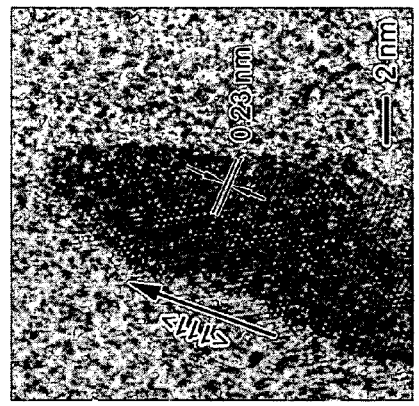
Figure 3A:
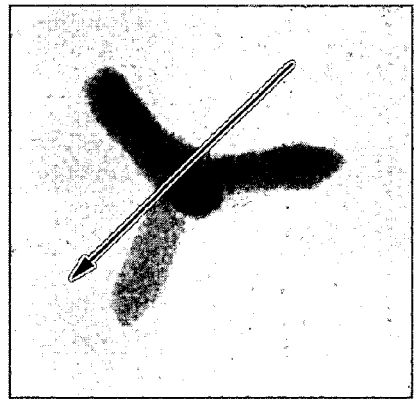
Figure 3C:
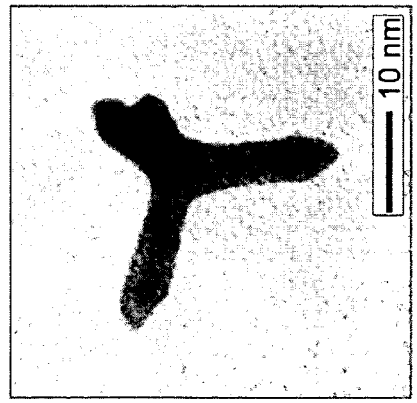
Figure 4B:
FIGS. 4A-4D are TEM and HRTEM images of two types of four-armed platinum nanostructures with different configurations.
Figure 4D:
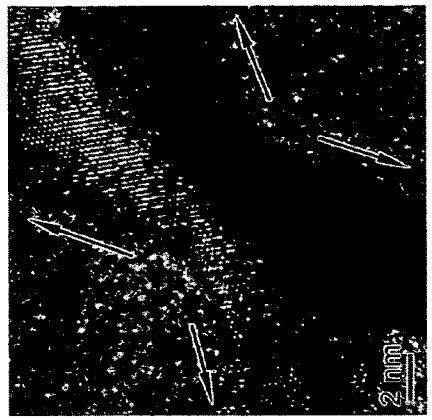
Figure 4A:
Figure 4C:
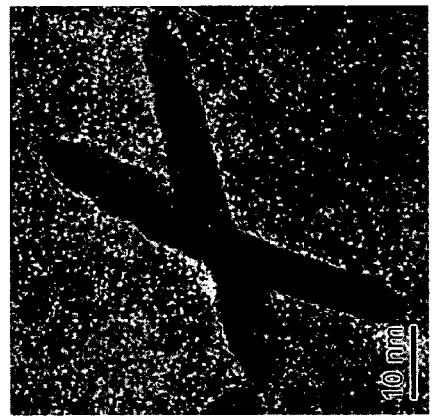

FIGS. 3A-3C show TEM images of an individual platinum multipod that were recorded by tilting the sample with different angles relative to the electron beam. The arrow in FIG. 3A indicates the axis against which the TEM grid was rotated by either −45° (FIG. 3B) or +45° degrees (FIG. 3C). Combined together, it is clear that this platinum nanostructure is a tetrapod, with four arms of roughly equal in length. FIG. 3D shows a typical HRTEM image taken from the tip portion of an arm, revealing its single crystalline structure and the <111> growth direction for each arm. The lattice spacing between the {111} planes, 0.23 nm, is consistent with that of the bulk crystal. The final product of each synthesis was usually a mixture of multipods containing 2 to 6 arms. Some of them were single crystals and others might contain twin defects. FIGS. 4A-4D compares two types of 4-armed nanostructures that were observed: the first type is a tetrapod with a tetrahedral configuration (FIG. 4A) while the second one has a square planar structure (FIG. 4C). Their HRTEM images (FIGS. 4B and 4D, respectively) clearly indicate that the tetrapod is a single-crystal and the square planar structure has a twin plane in the middle of the nanostructure. As a result of the structural difference, the angles between adjacent arms are also substantially different in these two types of 4-armed morphologies. For the tetrahedral configuration, it is believed that there was only one single-crystal seed involved and the four arms simply grew out of different sites (four of the eight corners) of the seed.

In summary, it has been demonstrated that platinum nanostructures with at least four different morphologies can be synthesized by controlling the reduction kinetics of a polyol process. The presence of both iron species and oxygen (or air) was found to control the reduction kinetics and hence morphology. Depending on the way the $Fe^{II}/Fe^{III}$ redox pair and oxygen (from air) were supplied to the reaction system, platinum nanostructures in the form of spherical particles, star-shaped particles, branched multipods, and nanowires could be obtained as the major product for each run of synthesis. The growth of nuclei is retarded by blocking their surface with oxygen and/or by facilitating the dissolution of atoms from the nuclei. The net result is reduction of supersaturation and induction of morphologies deviated from the thermodynamically favored ones.

Although the reduction kinetics could also be controlled by varying other experimental conditions such as temperature, it seems that the introduction of $Fe^{II}/Fe^{II}$ redox species and oxygen was the most convenient and versatile. For instance, the synthesis has also been performed at 100° C., 80° C., and 50° C. While the reduction became notably slower at both 100° C. and 80° C., it was still too fast to generate platinum nanostructures other than spherical particles. At 50° C., the reduction of $Pt^{II}$ species ceased and no $Pt^{0}$ species were observed after several days.

Example 2

Figure 5A:
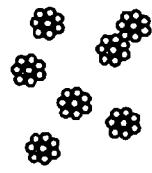
FIGS. 5A-5C depict different nanostructures formed by the syntheses shown in FIG. 5.
Figure 5B:
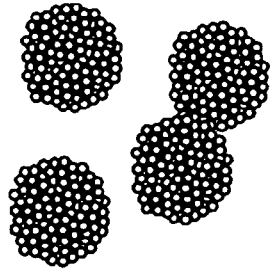
Figure 5C:
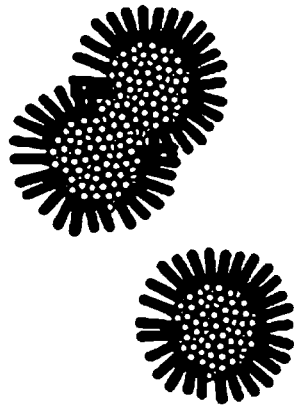
Figure 5:
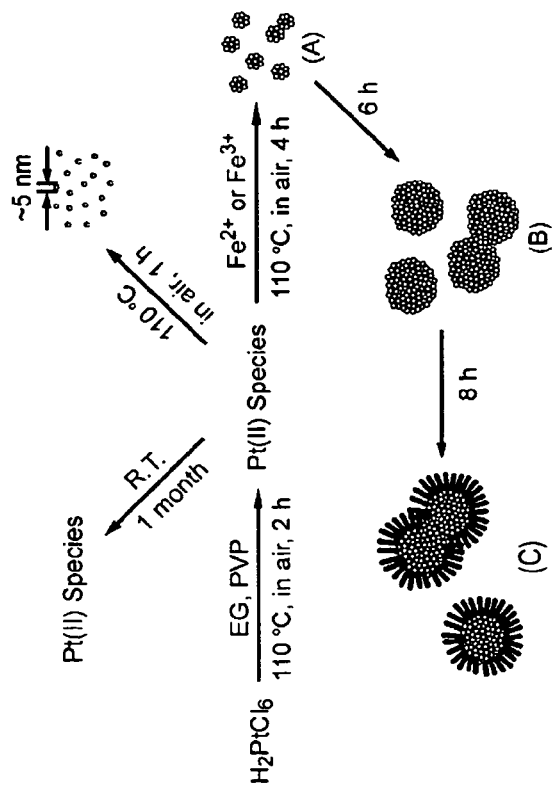
FIG. 5 is a schematic illustration detailing all major steps and changes involved in the formation of single crystal platinum nanowires through an iron-mediated polyol process. The final product looks like sea urchins.

Example 2 provides another method of forming single crystal nanowires in large quantities using the polyol process. The overall method is shown in FIG. 5. Again, a trace amount of $Fe^{2+}$ (or $Fe^{3+}$) species is used to greatly reduce the level of supersaturation of Pt atoms and thus the growth rate by slowing down the reduction reaction. For the protocol described here, the platinum nanowires also assembled into hierarchical structures (like a sea urchin) during synthesis as a result of salt-induced agglomeration.

In this so-called polyol process, ethylene glycol (EG) serves as both reducing agent and solvent. In the first step, Pt(II) species were formed when $H_2PtCl_6$ or $K_2PtCl_6$ was reduced by EG at 110° C. in the presence of poly(vinyl pyrrolidone) (PVP). In a typical synthesis, 4 mL of ethylene glycol (J. T. Baker, 9300-01) was placed in a 3-neck flask (equipped with a reflux condenser and a magnetic stirring bar embedded in PYREX glass) and heated in air at 110° C. for 1 hour to boil off trace amounts of water. Meanwhile, 0.033 g of hexachloroplatinic acid ($H_2PtCl_6$, Aldrich) and 0.045 g of poly(vinyl pyrrolidone) (PVP, M.W.=55,000, Aldrich) were separately dissolved in 2 mL of ethylene glycol at room temperature. These two solutions (with the molar ratio between Pt and the repeating unit of PVP being 1:5) were then added simultaneously to the flask dropwise within 1.5 min. The reaction was continued with heating at 110° C. in air for 3 hours. The solution turned from golden orange to green yellow and finally to brown and dark brown, indicating the formation of platinum nanoparticles. For iron-mediated synthesis, 20 µL of 2 mM iron species ($FeCl_3$ or $FeCl_2$, Aldrich, both pre-dissolved in ethylene glycol) was introduced into the system after the reaction had proceeded in air at 110° C. for 2 h (or when the solution turned into a green-yellow color). In this case, the final solution was colorless with black aggregates at the bottom of the flask. Similar results were obtained when $H_2PtCl_6$ was exchanged with $K_2PtCl_6$. After another 18 h, the product was collected by centrifugation, washed with ethanol several times to remove ethylene glycol and excess PVP, and then characterized by scanning electron microscopy (SEM), transmission electron microscopy (TEM), high-resolution TEM, and powder X-ray diffraction (XRD).

Figure 8A:
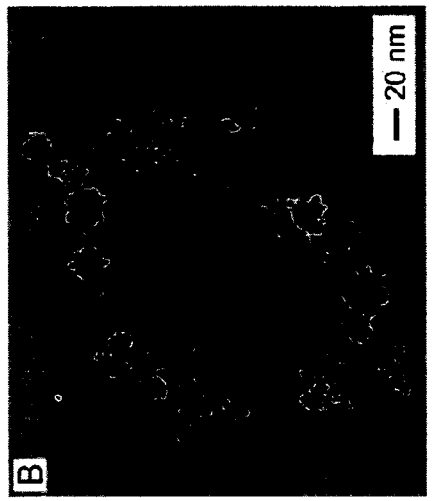
FIG. 8A is a TEM image of the final product when the synthesis was performed without adding any iron species.
Figure 8B:
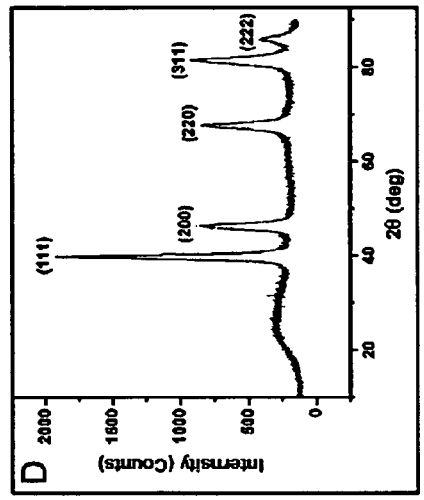
FIG. 8B is a TEM image of the intermediate-A depicted in FIG. 5.
Figure 8C:
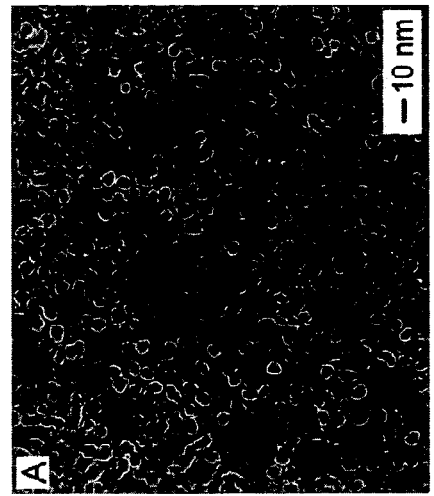
FIG. 8C is an SEM image of the intermediate-B shown in FIG. 5, which had no platinum nanowires on the surface of the agglomerates.

At room temperature, the Pt(II) species were stable and no particles were formed when the solution was stored in a vial for one month. When the reaction continued in air at 110° C., the Pt(II) species were reduced slowly to generate platinum nanoparticles with a diameter of ~5 nm (FIG. 8A). If a small amount of $FeCl_3$ or $FeCl_2$ was added (with a final concentration of 5 µM) after the reaction had proceeded for 2 hours, platinum nanoparticles were produced at a relatively slower rate and they tended to assemble into spherical agglomerates and larger structures. This agglomeration might be attributed to the destruction of stabilization layer around each platinum nanoparticle. Interestingly, the Pt(II) species were reduced at an extremely slow rate by the end of the reaction, and the resultant Pt atoms started to nucleate and grow into uniform nanowires on the surface of each agglomerate. Note that PVP had to be present in the synthesis; otherwise, no platinum nanowires could be formed.

Figure 6B:
FIGS. 6A-6D are SEM images of hierarchically structured platinum agglomerates that were obtained as the final product of an iron-mediated polyol process.
Figure 6D:
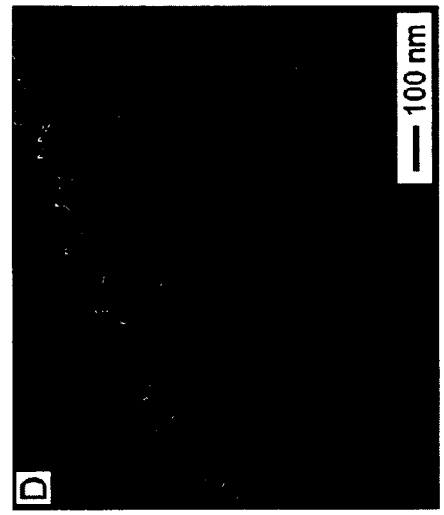
Figure 6A:
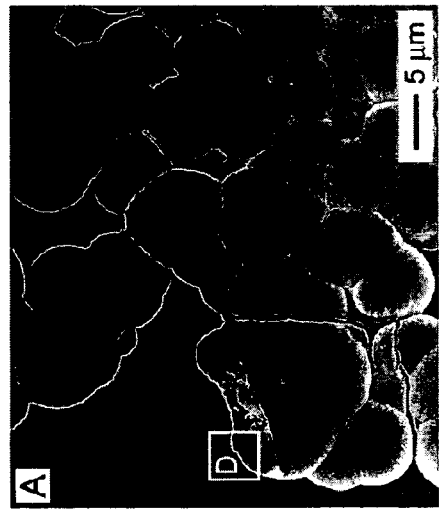
Figure 6C:
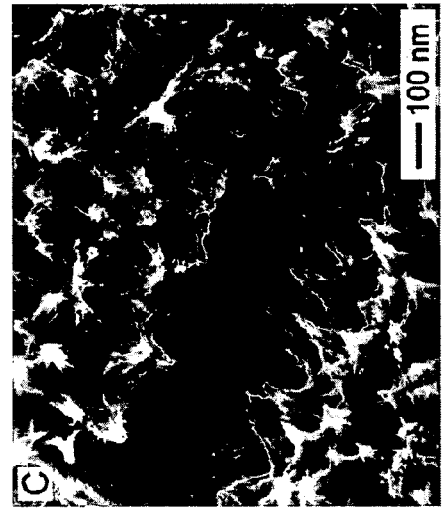

FIGS. 6A-6D show SEM images of a typical product at three different magnifications. Consistent with the drawing in FIG. 5, the product contained micrometer-sized agglomerates of platinum nanoparticles, with the surface covered by a densely packed array of platinum nanowires. These agglomerates could be further fused into larger structures. FIG. 6D shows SEM image taken from the cross-sectional edge (as indicated by the box in FIG. 6A) of an agglomerate, confirming that its interior, indeed, consisted of a densely packed lattice of platinum nanoparticles; and that platinum nanowires could only be found on the surface of each agglomerate. EDX analysis also established that both interior and surface of the agglomerate were composed of elemental platinum.

The SEM sample was prepared by placing a drop of the final product (suspended in ethanol) on a carbon tape, and letting it dry under ambient conditions. For the preparation of the micro-tomed sample (FIGS. 7A and 7B), the dried product was dispersed in the Spurr's epoxy with a low viscosity (Polysciences, Warrington, Pa.) and then polymerized at 70° C. for 24 hours. A micro-tome (Reicher/Jung Ultracut E, Leica, Arcadia, Calif.) equipped with a diamond knife was used to cut the cured epoxy resin into slices of <100 nm in thickness. These slices were then placed on a carbon-coated copper grid for TEM observation. For FIGS. 7C and 7D, the suspension in ethanol was briefly sonicated using a Sonics Vibra-Cell VCX-750 at an amplitude of 20% for 30 s, followed by centrifugation. A drop of the supernatant was then placed on a copper grid coated with carbon, followed by solvent evaporation under ambient conditions.

SEM images were taken using a Siron XL field-emission microscope (FEI, Hillsboro, Oreg.) operated at an acceleration voltage in the range of 5-10 kV. TEM imaging was done using a TOPCON 002B microscope with the high-resolution pole piece operated at 200 kV. The UV-Vis spectra were obtained using a Hewlett Packard 8452A diode array spectrophotometer. XRD patterns were recorded on a Philips 1820 diffractometer equipped with a Cu—Kα radiation source (E=8.04 keV, λ=1.544 Å). X-ray photoelectron spectroscopy (XPS) measurements were performed using a Surface Science X-Probe spectrometer equipped with an Al—Kα monochro-matized X-ray source (E=1486.6 eV). The instrument was operated at a pressure of 5×10$^{-9}$ Torr in the analysis chamber. The X-ray spot had an elliptical shape with a short axis of 800 μm when focused on the surface, and the analyzer had an angle of 55° with respect to the surface normal of the sample. Photoelectrons were collected with a pass energy of 150 eV for surveys, and 50 eV for high-resolution spectra. The binding energies were calculated with a reference to the maximum intensity of the C(1s) signal at 285.0 eV. Analysis of the spectra was done using ESCA VB data reduction software (Service Physics). All data shown in FIGS. 9A-9E were fit with double peaks having a ratio of ~0.8:1 in height, and a splitting of ~3.35 eV. Small pieces of a silicon wafer (0.5×0.5 cm$^2$ in size) were used as the substrates for all XPS samples.

Figure 8D:
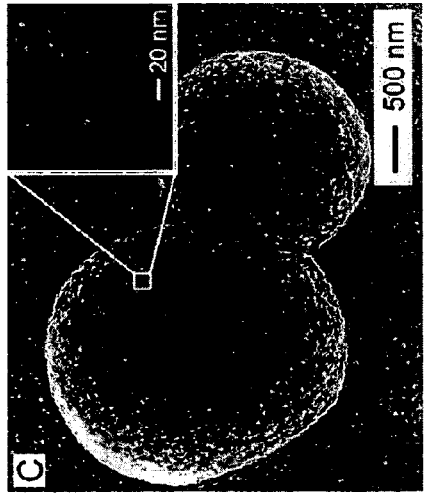
FIG. 8D is an X-ray diffraction spectrum of platinum nanowires that were synthesized with the mediation of ferric species, followed by separation from the agglomerates of platinum nano-particles.

To examine the hierarchical structure in more detail, the agglomerate was micro-tomed and then examined at its cross-section under TEM. A typical example is shown in FIG. 7A. FIG. 7B gives a blow-up view of the portion indicated by a box in FIG. 7A. It is clear that the nanowires only covered the outer surface of this agglomerate with a thickness of ~100 nm while the interior of this agglomerate contained a dense array of nanoparticles resembling the microscopic variant of a sea urchin with spines. Since the nanowires were loosely attached to the surfaces of agglomerates, it was possible to release them by brief sonication without breaking the agglomerates. Once freed, the nanowires could be recovered by centrifugation and then redispersed in ethanol or water without introducing additional surfactants. FIG. 7C shows typical TEM image of pure platinum nanowires (~5 nm in diameter) obtained using this procedure. The inset gives a selected-area electron diffraction (SAED) pattern, with the four rings indexed to the {111}, {200}, {220}, and {311} diffractions, respectively. It can be concluded that the platinum nanowires synthesized using this method are crystallized in a face-centered cubic (fcc) structure similar to the bulk solid. This position is also supported by the XRD pattern (FIG. 8D), which was taken from a collection of nanowires of several syntheses. FIG. 7D shows a HRTEM image recorded from the end of a single platinum nanowire, indicating that the nanowire grew along the <111> direction. The lattice spacing between the {111} planes, 0.23 nm, is also in agreement with that of the bulk crystal.

In this synthesis, the presence of both iron species and air was critical to the formation of platinum nanowires. When the synthesis was performed under nitrogen gas, the reduction was much faster than in air, and only nanoparticles were formed. This observation implies that the absorption of oxygen from air on the surface of platinum nanoparticles was able to slow down the auto-catalytic reduction of Pt compounds. Based on the results of XPS and UV-Vis measurements, the overall reduction is believed to proceed in two steps, involving the formation of some Pt(II) intermediate species (FIG. 5). FIGS. 9A-9E shows the high-resolution XPS spectra in the Pt(4f) region, from which we could identify different oxidation states for platinum that were involved at different stages of the synthesis. The XPS data also served as a reference to assign the peaks in the UV-Vis spectra (FIGS. 10A-10D) that were taken from the corresponding samples. The relevant data of UV-Vis and XPS measurements are summarized in Table 1.

TABLE 1

Summary of the UV-Vis and XPS Data Analysis

| | | XPS Pt(4f$_{7/2}$) Signals[a] | | | | | |
|---|---|---|---|---|---|---|---|
| | UV-Vis | Pt(IV) | | Pt(II) | | Pt(0) | |
| Reaction Time (h) | Major Peak (nm) | BE (eV)[b] | (%)[c] | BE (eV)[b] | (%)[c] | BE (eV)[b] | (%)[c] |
| 0 | 266 | 74.7 | 40 | 72.5 | 60 | — | — |
| 0.5 | 266 | 74.6 | 28 | 72.9 | 72 | — | — |
| 1 | 266 | 74.8 | 30 | 73.1 | 70 | — | — |
| 1.5 | 260[d] | — | — | 73.4 | 100[d] | — | — |
| 2 | 248 | — | — | 73.4 | 100 | — | — |
| 2.5 | 248 | — | — | 73.5 | 90 | 71.9 | 10 |
| 3 | — | — | — | 72.8 | 36 | 71.2 | 64 |
| 4 | — | — | — | 72.3 | 18 | 70.8 | 82 |
| Particles (washed) | — | — | — | 72.7 | 17 | 71.2 | 83 |

[a]Typical shifts for the Pt(4f$_{7/2}$) peaks: Pt(IV), 74.5-75.7 eV; Pt(II), 72.0-74.4; and Pt(0), 70.8-71.3 eV. Source: Wagner, C. D.; Riggs, W. M.; Davis, L. E.; Moulder, J. F.; Muilenberg, G. E. *Handbook of X-Ray Photoelectron Spectroscopy*, Perkin-Elmer Corp., Eden Prairie, MN, 1978.
[b]Binding energy (BE) referenced to C(1s) at 285.0 eV.
[c]Values are susceptible to variations within ±5%.
[d]The appearance of a broad peak in the UV spectrum indicates the presence of a small amount of Pt(IV) in the reaction mixture. XPS could not resolve the corresponding signal, suggesting that the amount of Pt(IV) was below the detection limit. This discrepancy was probably an artifact of sample preparation since long drying periods (~2 days) were required, during which the reduction of the remaining Pt(IV) was likely to continue.

The spectra shown in FIGS. 9A-9E and the corresponding fitting curves indicate that Pt(IV) was reduced by EG in two steps, with the first step yielding a Pt(II) species that was further reduced to Pt(0). The platinum nanoparticles mainly consisted of Pt(0), but some Pt(II) species remained in the sample even after several rounds of washing with ethanol. The shift in the binding energies of the Pt(II) species might reflect difference in chemical environment at each step of the synthesis. The intermediate Pt(II) species did not exhibit notable changes when the reaction mixture was stored at room temperature for one month.

These data suggest that Pt(IV) was fully reduced to Pt(II), and no Pt(0) was formed after the reaction had proceeded for 2 hours. Once the nucleation of Pt(0) particles had started, further reduction of the Pt(II) species was accelerated via an auto-catalytic process. Although the presence of oxygen could slow down this process, the reduction was still too fast to induce anisotropic growth. In contrast, reduction of the Pt(II) species was largely diminished when $Fe^{2+}$ or $Fe^{3+}$ was added to the reaction mixture, as depicted in FIGS. 10A-10D. Since $Fe^{2+}$ could be readily converted to $Fe^{3+}$ by oxygen under the conditions used to perform the synthesis, the function of both $Fe^{2+}$ and $Fe^{3+}$ species seemed to be similar: to oxidize Pt(0) to Pt(II) (by $Fe^{3+}$) and thus greatly reduce the supersaturation of Pt atoms. The resultant $Fe^{2+}$ could be recycled back to $Fe^{3+}$ by oxygen, so that only a small amount of $Fe^{2+}$ or $Fe^{3+}$ was needed in this synthesis.

In summary, the polyol reduction could be significantly slowed down to induce anisotropic growth in an isotropic medium by adding a small amount of $Fe^{2+}$ or $Fe^{3+}$ species. The initial product of such a synthesis was platinum nanoparticles (~5 nm in size) that existed in the form of micrometer-sized agglomerates. Once the supersaturation had been reduced to a certain level, the growth of Pt atoms would be switched to a highly anisotropic mode to form uniform platinum nanowires on the surface of each agglomerate. Since the Pt(II) species existed in the solution at a low concentration for a long period of time, the Pt atoms could grow into straight nanowires as long as about 100 nm and having a diameter of about 5 nm. After synthesis, the platinum nanowires could be separated from the agglomerates of platinum nanoparticles via a combination of brief sonication and centrifugation.

Without further elaboration, it is believed that one skilled in the art can use the preceding description to utilize the invention to its fullest extent. The examples and embodiments disclosed herein are to be construed as merely illustrative and not a limitation of the scope of the present invention in any way. It will be apparent to those having skill in the art that changes may be made to the details of the above-described embodiments without departing from the underlying principles of the invention. In other words, various modifications and improvements of the embodiments specifically disclosed in the description above are within the scope of the appended claims. The scope of the invention is therefore defined by the following claims.

The invention claimed is:

1. A method for forming platinum nanowires comprising:
    adding an iron(II) species or an iron(III) species to a reaction mixture comprising a Pt(II) species, a polyol reducing agent, and poly(vinyl pyrrolidone), to form a second reaction mixture; and
    heating the second reaction mixture for a period of time suitable for the formation of platinum nanowires.

2. The method of claim 1, wherein the second reaction mixture is heated in the presence of air.

3. The method of claim 1, wherein the second reaction mixture is heated in the presence of oxygen.

4. The method of claim 1, wherein the reaction mixture is formed by heating $H_2PtCl_6$ or $K_2PtCl_6$ in the presence of the polyol reducing agent and poly(vinyl pyrrolidone).

5. The method of claim 1, further comprising separating the platinum nanowires from the second reaction mixture.

6. The method of claim 5, wherein the separating comprises sonication.

7. The method of claim 1, wherein the polyol reducing agent comprises ethylene glycol.

8. The method of claim 1, wherein the platinum nanowires are single-crystal platinum nanowires.

9. The method of claim 1, wherein the platinum nanowires have a mean diameter of about 5 nanometers.

10. The method of claim 1, wherein the platinum nanowires have a mean length of less than about 250 nanometers.

11. The method of claim 1, wherein the platinum nanowires have a mean length of less than about 250 nanometers; and a mean diameter of about 5 nanometers.

* * * * *

UNITED STATES PATENT AND TRADEMARK OFFICE
CERTIFICATE OF CORRECTION

| | |
|---|---|
| PATENT NO. | : 8,114,187 B2 |
| APPLICATION NO. | : 11/197745 |
| DATED | : February 14, 2012 |
| INVENTOR(S) | : Xia et al. |

It is certified that error appears in the above-identified patent and that said Letters Patent is hereby corrected as shown below:

In Column 1, line 15, in the section labeled Federally Sponsored Research or Development please delete "This work has been supported in part by a DARPA-DURINT subcontract from Harvard University, a fellowship from the David and Lucile Packard Foundation and an IGERT Fellowship Award (supported by the NSF, DGE-9987620)", replace with --This invention was made with government support under N00014-01-1-0782 awarded by the Office of Naval Research and DGE9987620 awarded by National Science Foundation. The government has certain rights in the invention--.

Signed and Sealed this
Third Day of April, 2012

David J. Kappos
*Director of the United States Patent and Trademark Office*